United States Patent [19]

Engeler et al.

[11] Patent Number: 4,468,574

[45] Date of Patent: Aug. 28, 1984

[54] DUAL GATE CMOS TRANSISTOR CIRCUITS HAVING REDUCED ELECTRODE CAPACITANCE

[75] Inventors: William E. Engeler; Moshe Mazin, both of Scotia, N.Y.

[73] Assignee: General Electric Company, Schenectady, N.Y.

[21] Appl. No.: 374,586

[22] Filed: May 3, 1982

[51] Int. Cl.³ ............... H03K 19/017; H03K 19/094; H03K 19/20

[52] U.S. Cl. .................................. 307/451; 307/443; 307/450; 357/23

[58] Field of Search ............................. 307/450–451, 307/443, 469, 303–304, 576, 579, 585; 357/23 MG, 42

[56] References Cited

U.S. PATENT DOCUMENTS

| | | | |
|---|---|---|---|
| 3,657,614 | 4/1972 | Cricchi | 357/23 MG X |
| 4,041,519 | 8/1977 | Melen | 357/23 MG X |
| 4,074,150 | 2/1978 | Buckley et al. | 307/443 X |
| 4,122,360 | 10/1978 | Kawagai et al. | 307/450 X |
| 4,306,352 | 12/1981 | Schrader | 357/23 MG X |
| 4,319,263 | 3/1982 | Rao | 357/23 S X |
| 4,417,161 | 11/1983 | Uya | 307/451 X |

OTHER PUBLICATIONS

W. P. Noble, Jr., "Short–Channel Effects in Dual–Gate Field–Effect Transistors", in IEEE Int. Electron Dev. Mtg., Dig. Tech. Papers, Dec. 1978, pp. 483–486.

Hans G. Dill, "A New Insulated Gate Tetrode With High Drain Breakdown Potential and Low Miller Feedback Capacitance," IEEE Transactions on Electron Devices, vol. ED-15, No. 10, Oct. 1968.

Primary Examiner—Stanley D. Miller
Assistant Examiner—David R. Hudspeth
Attorney, Agent, or Firm—Julius J. Zaskalicky; James C. Davis, Jr.; Marvin Snyder

[57] ABSTRACT

Dual gate P-channel and N-channel transistors are interconnected in various configurations to provide logic circuits such as inverters, NAND gates, NOR gates, and Exclusive-OR gates.

2 Claims, 8 Drawing Figures

DUAL GATE CMOS TRANSISTOR CIRCUITS HAVING REDUCED ELECTRODE CAPACITANCE

The present invention relates, in general, to CMOS (complementary-metal-oxide-semiconductor) logic circuits.

CMOS logic circuits are circuits which utilize P-channel and N-channel transistors in various circuit configurations to provide such circuits as inverters, NAND gates, NOR gates etc. The inverter is a basic circuit configuration and comprises a P-channel and an N-channel transistor in which the source-to-drain conduction paths are connected in series circuit between a pair of reference potentials. The gates of the transistors are connected to an input terminal. The drains of the transistors are connected to an output terminal. In response to a low absolute level at the input terminal a high level is produced at the output terminal, and conversely in response to a high absolute level at the input terminal a low absolute level is produced at the output terminal. A particular advantage of CMOS circuits is low consumption of operating power. The speed of response of the CMOS circuits is dependent on the capacitance of the gating electrodes and also on the capacitance of the drains of the transistors with respect to the substrate. When conventional devices and CMOS circuits are scaled down to provide smaller geometries to increase the speed of response of the circuit, physical limitations arise as to the extent to which the gate electrodes of the transistors may be reduced in length and the extent to which the source and drain regions of the transistors may be reduced in size to reduce the capacitance thereof. Further, in prior art structures, the gate electrodes overlap the drain regions constituting the output node and produce an additional capacitive effect which is enhanced by the action of the output node in a manner analogous to Miller effect capacitance of linear circuits. In conventional CMOS inverter circuits the Miller effect capacitance becomes more dominant as the devices are scaled down.

The present invention is directed to minimizing limitations, such as described above, in conventional CMOS logic circuits thereby enabling not only circuits with reduced power consumption to be provided but also circuits of higher speed to be provided.

In accordance with an illustrative embodiment of the present invention, there is provided a first well region of semiconductor material of N-type conductivity having a major surface. A first region of P-type conductivity is provided in the first well region adjacent the major surface thereof. Means are provided for connecting the first well region to a first reference potential. A second region of P-type conductivity is provided in the first well region adjacent the major surface thereof and spaced from the first region of P-type conductivity to define a first channel region therebetween. A first gate electrode insulatingly overlying a first portion of the first channel region and a portion of the first region of P-type conductivity is provided. A second gate electrode insulatingly overlying a second portion of the first channel region contiguous to the second region of P-type conductivity is provided. The first portion and the second portion of the first channel region are contiguous.

A second well region of semiconductor material of P-type conductivity having a major surface is provided. Means are provided for connecting the second well region to a second reference potential. The first reference potential is positive with respect to the second reference potential. A first region of N-type conductivity is provided in the second well region adjacent the major surface thereof. A second region of N-type conductivity is provided in the second well region adjacent the major surface and spaced from the first region of N-type conductivity to define a second channel region therebetween. A third gate electrode insulatingly overlying a first portion of the second channel region and a portion of the first region of N-type conductivity is provided. A fourth gate electrode insulatingly ovelying a second portion of the second channel region contiguous to the second region of N-type conductivity is provided. The first portion and the second portion of the second channel region are contiguous.

Means are provided for connecting the first gate electrode and the third gate electrode to an input terminal. Means are provided for connecting the second region of P-type conductivity and the second region of N-type conductivity to an output terminal. Circuit means are provided for connecting the first region of P-type conductivity to the aforementioned first reference potential. Circuit means are provided for connecting the first region of N-type conductivity to the aforementioned second reference potential. Means are provided for connecting the second gate electrode to a third reference potential sufficiently negative with respect to the first reference potential to render the second portion of the first channel region conductive. Means are provided for connecting the fourth gate electrode to a fourth reference potential sufficiently positive with respect to the second reference potential to render the second portion of the second channel region conductive.

The features which are believed to be characteristic of the present invention are set forth with particularity in the appended claims. The invention itself, both as to its organization and method of operation, together with further objects and advantages thereof may best be understood by reference to the following description taken in connection with the accompanying drawings in which:

Figure 1:
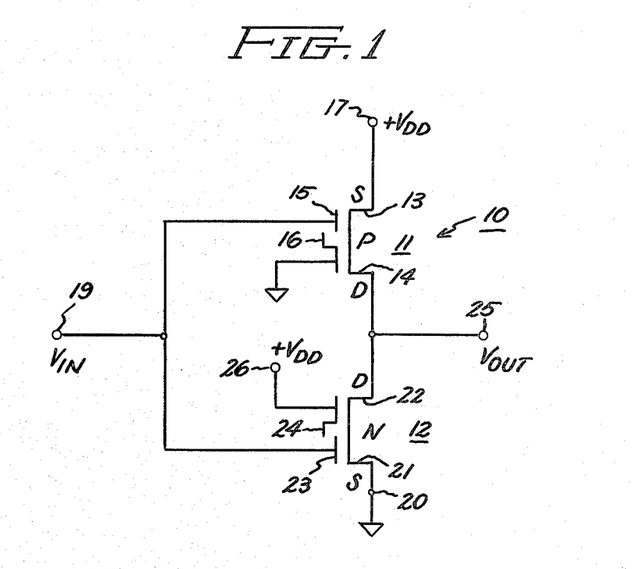
FIG. 1 is a schematic diagram of one embodiment of the present invention.

Reference is now made to FIG. 1 which shows a schematic diagram of an inverter circuit in accordance with the present invention. The circuit includes a first P-channel transistor 11 and a second N-channel transistor 12. Each of the transistors are dual gate transistors of the kind described and claimed in U.S. patent application Ser. No. 353,441 assigned to the assignee as the present invention and incorporated herein by reference thereto. The first transistor 11 includes a source 13, a drain 14, a first or source-adjacent gate 15 and a second or drain-adjacent gate 16. The second transistor 12 includes a source 21, a drain 22, a third or source-adjacent gate 23 and a fourth or drain-adjacent gate 24. The source 13 of the first transistor is connected to a first supply terminal 17 to which a first reference potential $V_{DD}$ is applied. The drain 14 of the first transistor and the drain 22 of the second transistor 12 are connected to output terminal 25. The source 21 of the second transistor is connected to a second supply terminal 20 which is shown as connected to ground and referred to as a second reference potential. The potential $V_{DD}$ applied to terminal 17 is positive with respect to potential of terminal 20. The gate electrodes 15 and 23 are connected to an input terminal 19. The gate electrode 16 is connected to ground and the gate electrode 24 is connected to terminal 26 to which is provided potential $V_{DD}$.

Consider now the operation of the circuit of FIG. 1. When a low level signal, for example, ground potential is supplied to the gates 15 and 23, P-channel transistor 11 is turned on as both gates of this transistor are at ground potential causing the output terminal 25 to rise toward potential $V_{DD}$ or high level. The N-channel transistor 12 remains turned off as the potential on the gate electrode 23 is low with respect to source electrode 21, and is insufficient to turn on the channel region to transistor 12. When the signal applied to terminal 19 is high, for example $V_{DD}$, the first transistor 11 is turned off as gate electrode 15 is raised to potential $V_{DD}$ which is insufficient to form a conductive channel in the channel region of the transistor 11. The transistor 12 is turned on as the potential on the gate electrode 23 rises to potential $V_{DD}$. Thus, both channel portions of the channel region of transistor 12 are turned on thereby causing the potential at the output terminal 22 to drop toward ground or low level.

Figure 2:
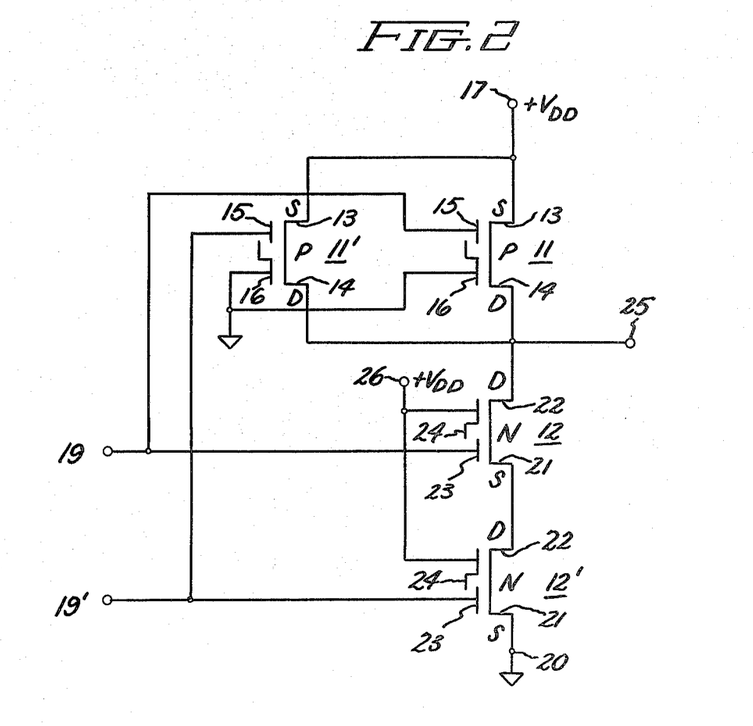
FIG. 2 is a schematic diagram of a NAND gate in accordance with the present invention.

Reference is now made to FIG. 2 which shows a schematic diagram of a NAND gate in accordance with the present invention. The circuit includes a pair of P-channel transistors 11 and 11' and a pair of N-channel transistors 12 and 12'. Each of the transistors are dual gate transistors of the kind described and claimed in the aforementioned U.S. patent application Ser. No. 353,441.ial $V_{DD}$ is applied. The drains 14 of the P-channel transistors 11 and 11' are connected to an output terminal 25. The source-adjacent gate 15 of P-channel transistor 11 is connected to a first input terminal 19. The source-adjacent gate 15 of the P-channel transistor 11' is connected to a second input terminal 19'. The drain-adjacent gate 16 of the P-channel transistors 11 and 11' are connected to ground. The drain 22 of N-channel transistor 12 is connected to output terminal 25. The source of N-channel transistor 12 is connected to the drain of N-channel transistor 12'. The source of N-channel transistor 12 ' is connected to terminal 20 which is connected to ground referred to as a second reference potential. The source-adjacent gate 23 of N-channel transistor 12 is connected to first input terminal 19. The source-adjacent gate 23 of the N-channel transistor 12' is connected to the second input terminal 19'. The drain-adjacent gates 24 of the N-channel transistors 12 and 12' are connected to terminal 26 to which is provided potential $V_{DD}$.

Consider now the operation of the circuit of FIG. 2. With ground potential applied to the drain adjacent gates 16 of transistors 11 and 11', the portions of the channel regions thereof underlying the drain-adjacent gates are inverted or become conductive. Also, with potential $V_{DD}$ applied to the drain adjacent gates 24 of the N-channel transistors 12 and 12', the channel regions of these transistors underlying the drain adjacent gates 24 become conductive. Thus, when a high level signal is applied to each of the input electrodes 19 and 19', and hence to source-adjacent gates 23 of transistors 12 and 12', each of the transistors 12 and 12' become conductive thereby lowering the potential at the output terminal 25 to substantially ground or low level. With high level signals also applied to the source-adjacent gates 15 of transistors 11 and 11', they become nonconductive and hence output terminal 25 is disconnected from supply terminal 17. When the signal applied to either of terminals 19 and 19' is low and signal applied to the other terminal is high, one of the N-channel transistors 12 and 12' becomes nonconductive and one of the P-channel transistors 11 and 11' becomes conductive. Accordingly, an output signal is provided at terminal 25 which is high. Also, when the signals applied to both terminals 19 and 19' are low, the N-channel transistors 12 and 12' become nonconductive and both P-channel transistors 11 and 11' become conductive providing a high level at output terminal 25. A particular advantage of the NAND circuit of FIG. 4 is that the output node 25 is isolated from the input nodes 19 and 19' by means of the drain-adjacent gates 16 of P-channel transistors 11 and 11' and by means of the drain-adjacent gates 24 of the N-channel transistors 12 and 12'.

Figure 3:
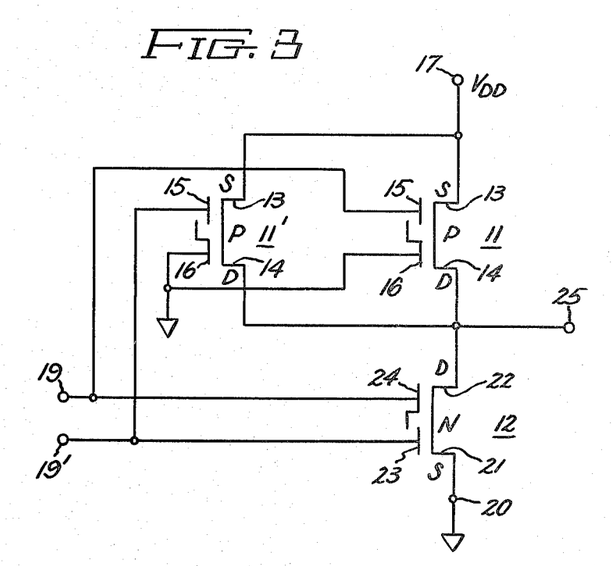
FIG. 3 is a schematic diagram of another NAND gate in accordance with the present invention.

Reference is now made to FIG. 3 which shows a schematic diagram of another embodiment of a NAND gate in accordance with the present invention. The NAND gate of FIG. 3 is similar to the NAND gate of FIG. 2 except that a single N-channel transistor is utilized. The circuit includes a pair of P-channel transistors 11 and 11' and an N-channel transistor 12. Each of the transistors are dual gate transistors of the kind described and claimed in the aforementioned U.S. patent application Ser. No. 353,441. Each of the P-channel transistors 11 and 11' includes a source 13, a drain 14, a source-adjacent gate 15 and a or drain-adjacent gate 16. The N-channel transistor 12 includes a source 21, a drain 22, a source-adjacent gate 23 and a drain-adjacent gate 24. The sources 13 of the P-channel transistors 11 and 11' are connected to a first supply terminal 17 to which a first reference potential $V_{DD}$ is applied. The drains 14 of the P-channel transistors 11 and 11' are connected to output terminal 25. The source-adjacent gate 15 of P-channel transistor 11 is connected to a first input terminal 19. The source-adjacent gate 15 of P-channel transistor 11' is connected to a second input terminal 19'. The drain-adjacent gates 16 of P-channel transistors 11 and 11' are connected to ground. The drain of the N-channel transistor 12 is connected to output terminal 25. The source 21 of N-channel transistor 12 is connected to a second supply terminal 20 which is connected to ground and referred to as a second reference potential. The drain-adjacent gate 24 of N-channel transistor 12 is connected to first input terminal 19. The source-adjacent gate 23 of N-channel transistor 12 is connected to second input terminal 19'.

Consider now the operation of the circuit of FIG. 3. With a high level signal applied to each of input terminals 19 and 19', the channel regions of the N-channel transistor 12 underlying the source-adjacent gate 23 and the drain-adjacent gate 24 thereof are inverted and rendered conductive thereby lowering the potential of the output terminal 25 toward ground or low level. As the potential on the source-adjacent gates 15 of P-channel transistors 11 and 11' is high, the channel portions of these transistors underlying these electrodes are not inverted and not conductive. Accordingly, terminal 25 is disconnected from terminal 17. When the signal applied to either terminals 19 and 19' is low and the signal applied to the other terminal is high, N-channel transistor 12 becomes nonconductive and one of the P-channel transistors 11 and 11' becomes conductive. Accordingly, an output signal is provided at terminal 25 which is high. Also, when the signals applied to both terminals 19 and 19' are low, the N-channel transistor 12 becomes nonconductive and both P-channel transistors 11 and 11' become conductive providing a high level at output terminal 25.

Figure 4:
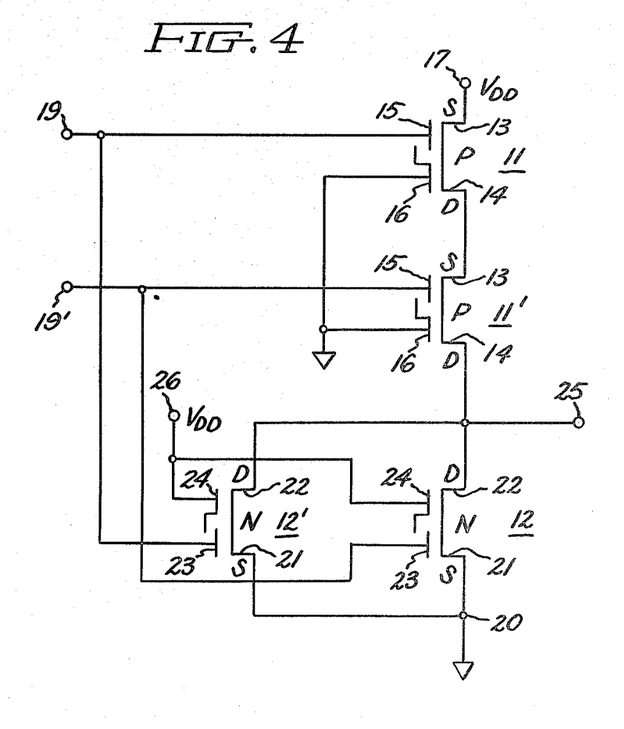
FIG. 4 is a schematic diagram of a NOR gate in accordance with the present invention.

Reference is now made to FIG. 4 which shows a schematic diagram of a NOR circuit in accordance with the present invention. The circuit includes a pair of P-channel transistors 11 and 11' and a pair of N-channel transistors 12 and 12'. Each of the transistors are dual gate transistors of the kind described and claimed in the aformentioned U.S. patent application Ser. No. 353,441. Each of the P-channel transistors 11 and 11' includes a source 13, a drain 14, a source-adjacent gate 15 and a drain-adjacent gate 16. Each of the N-channel transistors includes a source 21, a drain 22, a source-adjacent gate 23 and a drain-adjacent gate 24. The source 13 of the P-channel transistor 11 is connected to a first supply terminal 17 to which a first reference potential $V_{DD}$ is applied. The drain 14 of the P-channel transistor 11 is connected to the source 13 of the P-channel transistor 11'. The drain 14 of the P-channel transistor 11' is connected to output terminal 25. The source-adjacent gate 15 of P-channel transistor 11 is connected to a first input terminal 19. The source-adjacent gate 15 of the P-channel transistor 11 ' is connected to a second input terminal 19'. The drain-adjacent gates 16 of P-channel transistors 11 and 11' are connected to ground. The drains 22 of the N-channel transistors 12 and 12' are connected to output terminal 25. The sources 21 of N-channel transistor 12 and 12' are connected to a second supply terminal 20 which is connected to ground, referred to as a second reference potential. The source-adjacent gate 23 of N-channel transistor 12 is connected to input terminal 19'. The source-adjacent gate 23 of N-channel transistor 12' is connected to input terminal 19. The drain-adjacent gates 24 of N-channel transistors 12 and 12' are connected to terminal 26 to which is provided potential $V_{DD}$.

Consider now the operation of the circuit of FIG. 4. As the drain-adjacent gates 16 of the P-channel transistors 11 and 11' are at ground, the portions of the channel regions of these transistors underlying these gate electrodes are inverted or rendered conductive. Also, with the drain-adjacent gate electrodes 24 of N-channel transistors 12 and 12' connected to terminal 26 to which potential $V_{DD}$ is applied, the portions of the channel regions of the N-channel transistors 12 and 12' underlying these gate electrodes is inverted or rendered conductive. Accordingly, when a low level signal, for example at ground level, is applied to each of the input terminals 19 and 19', the portions of the channel regions of transistors 11 and 11' underlying the source-adjacent gate electrodes 15 thereof are inverted and rendered conductive. Thus, both transistors 11 and 11' are rendered conductive connecting the output terminal 25 to terminal 17 thereby producing a high level of signal at output terminal 25. The low level signal appearing on the source-adjacent gates 23 of N-channel transistors 12 and 12' are insufficient to cause inversion of the portions of the channel regions of these transistors underlying these gate electrodes. Accordingly, these transistors are nonconductive disconnecting output terminal 25 from ground. If either terminals 19 and 19' is at high level and the other is at low level, one of the P-channel transistors 11 and 11' becomes nonconductive thereby disconecting the output terminal 25 from the terminal 17 while one of the N-channel transistors 12 and 12' becomes conductive thereby connecting the output terminal 25 to ground and providing a low level of signal thereon. Also, when the signals applied to both terminals 19 and 19' are high, the P-channel transistors 11 and 11' become nonconductive and both of the N-channel transistors 12 and 12' become conductive providing a low level at output terminal 25.

Figure 5:
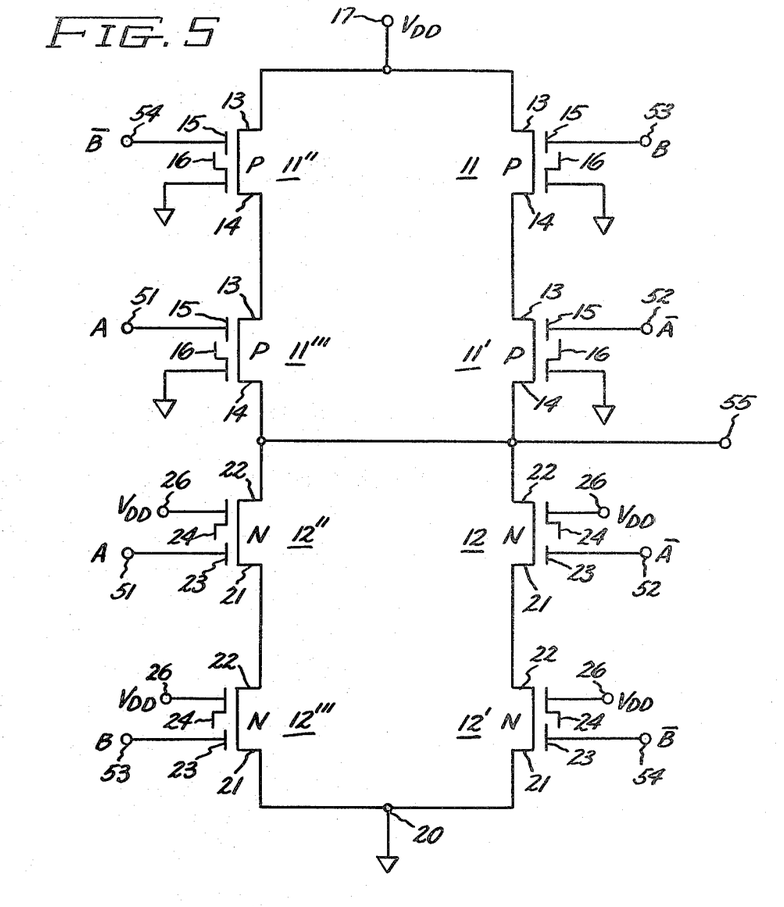
FIG. 5 is a schematic diagram of an Exclusive-OR gate in accordance with the present invention.

Reference is now made to FIG. 5 which shows a schematic diagram of an Exclusive-OR circuit in accordance with the present invention. The circuit includes four P-channel transistors 11, 11', 11" and 11''' and also includes four N-channel transistors 12, 12', 12" and 12'''. Each of the transistors are dual gate transistors of the kind described and claimed in the aforementioned U.S. patent application Ser. No. 353,441. Each of the P-channel transistors 11, 11', 11" and 11''' includes a source 13, a drain 14, a source-adjacent gate 15 and a drain-adjacent gate 16. Each of the N-channel transistors includes a source 21, a drain 22, a source-adjacent gate 23 and a drain-adjacent gate 24. The source 13 of the P-channel transistors 11 and 11" are connected to a first supply terminal 17 to which a reference potential $V_{DD}$ is applied. The drain 14 of P-channel transistor 11 is connected to the source 13 of P-channel transistor 11'. The drain 14 of P-channel transistor 11' is connected to output terminal 55. The drain 14 of P-channel transistor 11" is connected to the source 13 of P-channel transistor 11'''. The drain 14 of P-channel transistor 11''' is connected to output terminal 55. The source-adjacent gate 15 of P-channel transistor 11 is connected to input terminal 53. The source-adjacent gate 15 of P-channel transistor 11' is connected to input terminal 52. The source-adjacent gate 15 of P-channel transistor 11" is connected to input terminal 54. The source-adjacent gate 15 of P-channel transistor 11''' is connected to input terminal 51. The drain-adjacent gates 16 of P-channel transistors 11, 11', 11" and 11''' are connected to ground. The drains 22 of the N-channel transistors 12 and 12" are connected to output terminal 55. The source 21 of N-channel transistor 12 is connected to the drain 22 of N-channel transistor 12'. The source 21 of N-channel transistor 12' is connected to a second supply terminal 20 which is connected to ground, referred to as a second reference potential. The source 21 of N-channel transistor 12" is connected to the drain 22 of N-channel transistor 12'''. The source 21 of N-channel transistor 12''' is connected to terminal 20. The source-adjacent gate 23 of N-channel transistor 12 is connected to input terminal 52. The source-adjacent gate 23 of N-channel transistor 12' is connected to input terminal 54. The source-adjacent gate 23 of N-channel transistor 12" is connected to input terminal 51. The source-adjacent gate 23 of N-channel transistor 12''' is connected to input terminal 53. The drain-adjacent gates 24 of N-channel transistors 12, 12', 12" and 12''' are connected to a terminal 26 to which is provided potential $V_{DD}$.

Consider now the operation of the Exclusive-OR circuit of FIG. 5. The signals A, $\overline{A}$, B and $\overline{B}$ are digital signals which are applied to respective input terminals 51, 52, 53 and 54. $\overline{A}$ is signal A inverted and $\overline{B}$ is signal B inverted. As the drain-adjacent gate 16 of the P-channel transistor 11, 11', 11'' and 11''' are at ground, the portions of the channel regions of these transistors underlying these gate electrodes are inverted or rendered conductive. Also, with the drain-adjacent gates 24 of N-channel transistors 12, 12', 12'' and 12''' connected to terminal 26 to which potential $V_{DD}$ is applied, the portions of the channel regions of the N-channel transistors 12, 12', 12'' and 12''' underlying these gate electrodes are inverted or rendered conductive. Accordingly, when signals A and B are of low level, P-channel transistor 11 and P-channel transistor 11''' are rendered conductive as signals B and A are applied respectively to input terminal 53 and 51. As signals $\overline{A}$ and $\overline{B}$ are applied to input terminals 52 and 54, respectively, of transistors 11' and 11'', these transistors are maintained nonconductive. Accordingly, output terminal 55 is isolated from terminal 17 to which $V_{DD}$ is applied. With low level signals A and B applied, respectively, to terminals 51 and 53, N-channel transistors 12'' and 12''' are rendered conductive thereby connecting output terminal 55 to ground and providing a low level output. Similarly, when signals A and B are high level signals, P-channel transistor 11 and P-channel transistor 11''' are rendered nonconductive thereby isolating output terminal 55 from terminal 17. With $\overline{A}$ signal applied to source-adjacent gate 23 of N channel transistor 12 and signal $\overline{B}$ applied to source-adjacent gate 23 of N-channel transistor 12', these transistors become conductive thereby connecting the output terminal 55 to ground. Accordingly, when both signals A and B are high, a low level is provided at output terminal 55. When binary signal A is low and binary signal B is high, transistors 11'' and 11''' become conductive thereby connecting output terminal 55 to terminal 17 and providing a high level output. With signal A low, transistor 12'' becomes nonconductive and with signal $\overline{B}$ low transistor 12' also becomes nonconductive. Thus, output terminal 55 is disconnected from terminal 20. With binary signal A high and binary signal B low, P-channel transistor 11 and P-channel transistor 11' become conductive thereby connecting output terminal 55 to terminal 17 and providing a high level of output. With binary signal A high and binary signal B low N-channel transistor 12 and N-channel transistor 12''' are rendered nonconductive thereby disconnecting output terminal 55 from terminal 20. A particular advantage of the Exclusive-OR circuit of FIG. 5 is that the output node 55 is isolated from the input nodes 51, 52, 53 and 54 by means of the drain-adjacent gates 16 of P-channel transistors 11, 11', 11'' and 11''' and by means of drain-adjacent gates 24 of N-channel transistors 12, 12', 12'' and 12'''.

Figure 6:
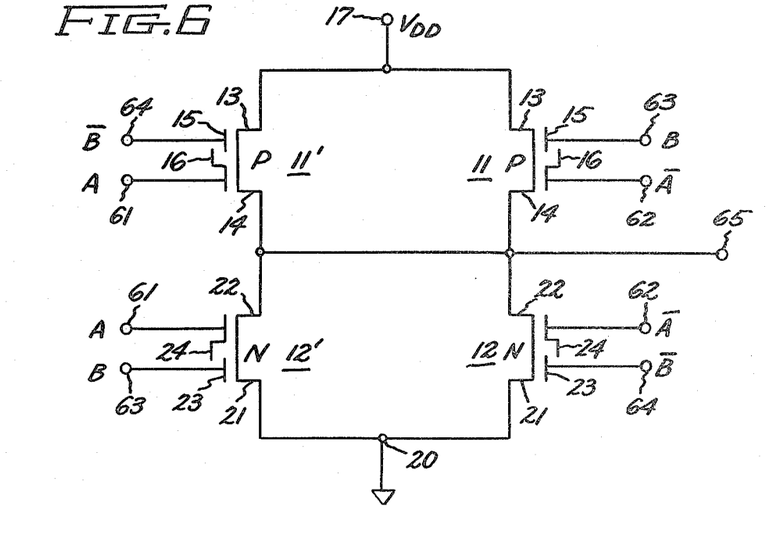
FIG. 6 is a schematic diagram of another Exclusive-OR gate in accordance with the present invention.

Reference is now made to FIG. 6 which shows a schematic diagram of another embodiment of an Exclusive-OR gate in accordance with the present invention. The circuit includes a pair of P-channel transistors 11 and 11' and a pair of N-channel transistors 12 and 12'. Each of the transistors are dual gate transistors of the kind described and claimed in the aforementioned U.S. patent application Ser. No. 353,441. Each of the P-channel transistors 11 and 11' includes a source 13, a drain 14, a source-adjacent gate 15 and a drain-adjacent gate 16. Each of the N-channel transistors includes a source 21, a drain 22, a source-adjacent gate 23 and a drain-adjacent gate 24. The sources 13 of the P-channel transistors 11 and 11' are connected to a first supply terminal 17 to which a first reference potential $V_{DD}$ is applied. The drains 14 of the P-channel transistors 11 and 11' are connected to output terminal 65. The source-adjacent gate 15 of P-channel transistor 11' is connected to input terminal 63. The drain-adjacent gate 16 of P-channel transistor 11' is connected to input terminal 62. The source-adjacent gate 15 of P-channel transistor 11' is connected to input terminal 64. The drain-adjacent gate of P-channel transistor 11' is connected to input terminal 61. The drains 22 of the N-channel transistors 12 and 12' are connected to output terminal 65. The sources 21 of N-channel transistors 12 and 12' are connected to a second supply terminal 20 which is connected to ground and referred to as a second reference potential. The drain-adjacent gate 24 of N-channel transistor 12 is connected to input terminal 62. The source-adjacent gate 23 of N-channel transistor 12 is connected to input terminal 64. The drain-adjacent gate 24 of N-channel transistor 12' is connected to input terminal 61, the source-adjacent gate 23 of N-channel transistor 12' is connected to input terminal 63.

Consider now the operation of the Exclusive-OR circuit of FIG. 6. The signals A, $\overline{A}$, B and $\overline{B}$ are digital signals which are applied to respective input terminals 61, 62, 63 and 64. $\overline{A}$ is signal A inverted and $\overline{B}$ is signal B inverted. When signals A and B are of low level, P-channel transistor 11 and P-channel transistor 11' are rendered nonconductive as signals $\overline{A}$ and $\overline{B}$ applied respectively to gate 16 of P-channel transistor 11 and to gate 15 of P-channel transistor 11' are high. Accordingly, output terminal 65 is isolated from terminal 17 to which $V_{DD}$ is applied. With low level signals A and B applied, respectively, to gates 23 and 24 of N-channel transistor 12, N-channel transistor 12 is rendered conductive thereby connecting output terminal 65 to ground and providing a low level output. Similarly, when signals A and B are high level signals, P-channel transistor 11 and P-channel transistor 11' are rendered nonconductive thereby isolating output terminal 65 from terminal 17. With signal A applied to gate 24 and signal B applied to gate 23 of N-channel transistor 12, N-channel transistor 12 becomes conductive thereby connecting the output terminal 65 to ground. Accordingly, when both signals A and B are high, transistor 11' becomes conductive thereby connecting output terminal 65 to terminal 17 and providing a high level output. With signal A low and with signal $\overline{B}$ low, N-channel transistors 12 and 12' become nonconductive. Thus, output terminal 65 is disconnected from terminal 20. With binary signal A high and binary signal B low, P-channel transistor 11 becomes conductive thereby connecting output terminal 65 to terminal 17 and providing a high level of output. With binary signal A high and binary signal B low, N-channel transistor 12 and N-channel transistor 12' are rendered nonconductive thereby disconnecting output terminal 65 from terminal 20.

Figure 7:
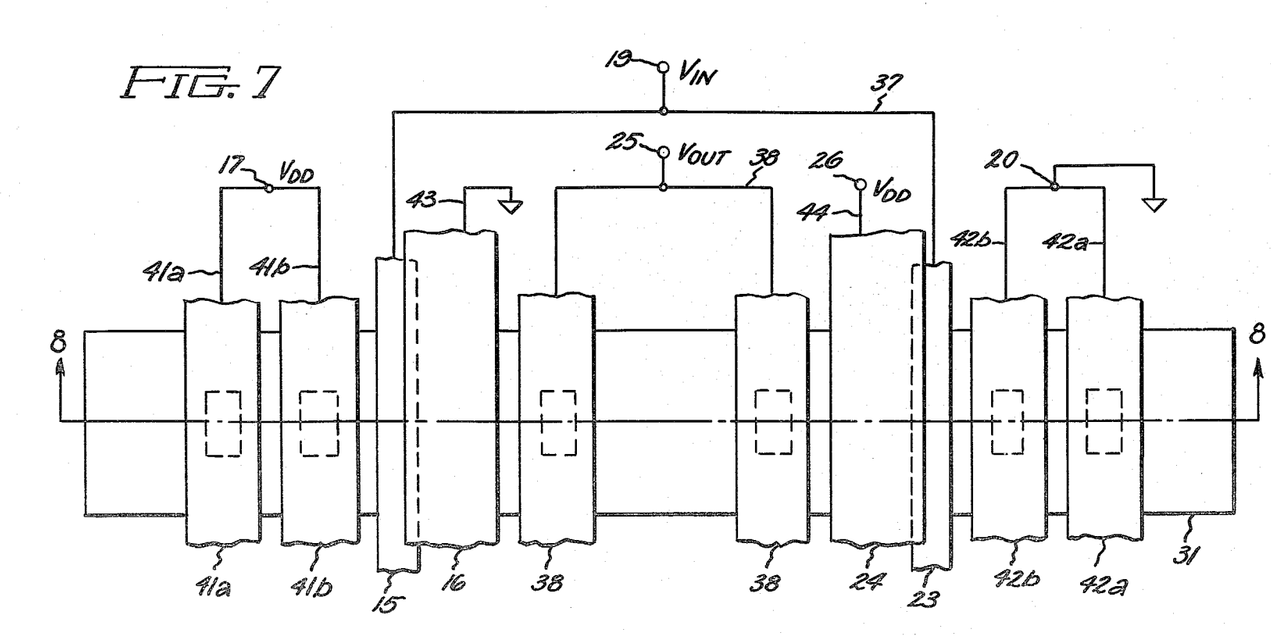
FIG. 7 is a plan view of one implementation of the CMOS circuit configurations of FIGS. 1-6.
Figure 8:
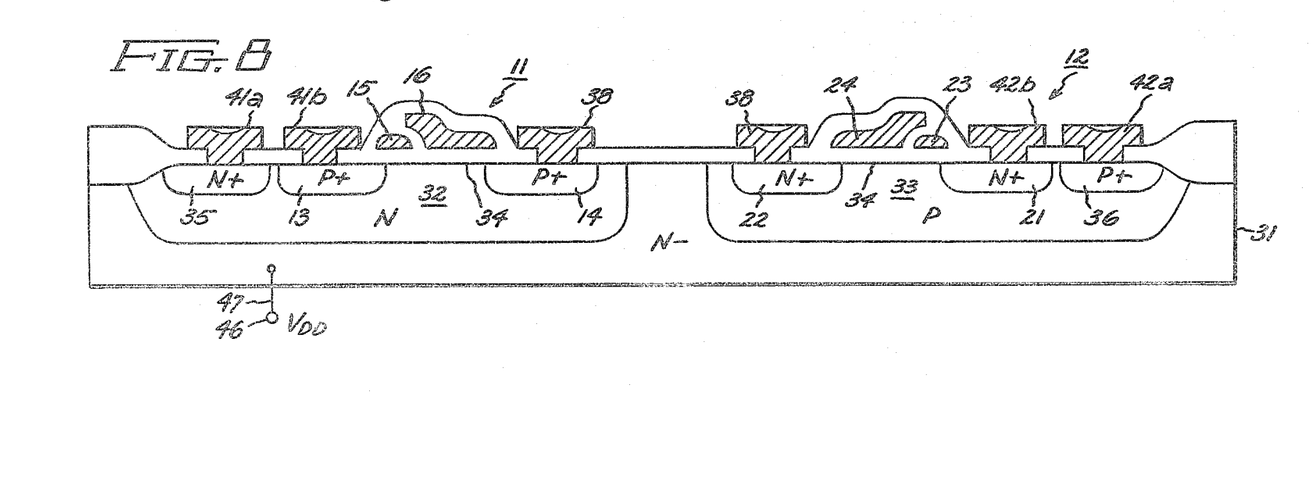
FIG. 8 is a sectional view of the implementation of FIG. 2 taken along sectional lines 3—3 thereof.

Reference is now made to FIGS. 7 and 8 which show a plan and a sectional view of an implementation in the CMOS circuit configuration consisting of a P-channel dual gate transistor and an N-channel dual gate transistor in the circuits of FIGS. 1–6. The specific implementation shown is of the inverter of FIG. 1. The elements of FIGS. 7 and 8 identical to the elements of FIG. 1 are identically designated. The first transistor 11 and the second transistor 12 are formed on a common substrate 31 of silicon semiconductor material of N-type conductivity. The first transistor 11 is formed in a first well region 32 of N-type conductivity of the substrate 31. The first transistor 11 includes a first region or source 13 of P-type conductivity adjacent a major surface 34 of the first well region 32. The first well region 32 is conductively connected to terminal 17 by means of conductive line 41a and N+ region 35 in the first well region. The first region 13 of P-type conductivity is conductively connected to terminal 17 by means of conductive line 41b. The first transistor 11 also includes a second region or drain 14 of P-type conductivity in the first well region 32 also adjacent the major surface 34 and spaced from the first region of P-type conductivity to define a first channel region in the first well region adjacent the major surface between the first region 13 of P-type conductivity and the second region 14 of P-type conductivity. A first gate electrode 15 is insulatingly spaced over a first portion of the first channel region and over a portion of the first region 13 of P-type conductivity. A second gate electrode 16 insulatingly overlies a second portion of the first channel region contiguous to the second region 14 of P-type conductivity. The first portion and the second portion of the first channel region are contiguous. The second transistor 12 is formed in a second well region 34 of P-type conductivity of the substrate 31. The second transistor 12 includes a first region or source 21 of N-type conductivity in the second well region adjacent the major surface 34 thereof. The second well region 33 is conductively connected to terminal 20 and ground by means of conductive line 42a and P+ region 36 in the second well region. The first region 21 of N-type conductivity is conductively connected to terminal 20 by means of conductive line 42b. The second transistor 12 includes a second region 22 of N-type conductivity in the second well region 33 adjacent the major surface 34 and spaced from the first region 21 of N-type conductivity to define a second channel region in the second well region between the first region of N-type conductivity 21 and the second region of N-type conductivity 22. A third gate electrode 23 insulatingly overlies a first portion of the second channel region and a portion of the first region 21 of N-type conductivity. A fourth gate electrode 24 insluatingly overlies a second portion of the second channel region contiguous to the second region 22 of N-type conductivity. The first portion and the second portion of the second channel region are contiguous. The first gate electrode 15 of the first transistor 11 and the first gate electrode 23 of the second transistor 12 are connected over a conductive line 37 to input terminal 19. The second region 14 of P-type conductivity of the first transistor 11 and the second region 22 of N-type conductivity of the second transistor 12 are connected over conductive line 38 to output terminal 25. The second gate electrode 16 of the first transistor 11 is connected by conductive line 43 to ground. The second gate electrode 24 of the second transistor 12 is connected by conductive line 44 to terminal 26. The substrate 31 is connected to terminal 46 over conductive line 47 to which potential $V_{DD}$ is applied. To provide an integrated circuit implementation of the combination of P-channel transistor 11 and N-channel transistor 12 of FIG. 2, conductive line 42b of FIG. 7 would be removed and would be replaced with the circuit consisting of the source to drain conduction path of N-channel transistor 12'. To provide an integrated circuit implementation of the combination of P-channel transistor 11' and N-channel transistor 12 of FIG. 4, conductive line 41b of FIG. 7 would be removed and would be replaced with the circuit consisting of the source to drain conduction path of P-channel transistor 11. To provide an integrated circuit implementation of the combination of P-channel transistor 11' and N-channel transistor 12 of FIG. 5, conductive line 41b of FIG. 7 would be removed and would be replaced with the circuit consisting of the source to drain conduction path of P-channel transistor 11. Also, conductive line 42b of FIG. 7 would be removed and would be replaced with the circuit consisting of the source to drain conduction path of N-channel transistor 12'.

While the invention has been described in an integrated circuit implementation in FIGS. 7 and 8 in which a twin tub or well process sequence has been employed with the N-type and P-type wells being formed in a relatively low conductivity N-type substrate, alternative CMOS fabrication procedures well known to those skiled in the art may be utilized, such as a P-well process in which P-wells are formed in relatively higher conductivity N-type substrates.

While the P-type and N-type conductivity well regions in FIGS. 7 and 8 are shown as formed in a substrate of a suitable semiconductor material, such as silicon, the P-type well and N-type well regions could be islands of silicon on a suitable substrate such as sapphire. In such configurations well region contacts would be replaced by equivalent island contacts and substrate contacts would be eliminated.

An inverter and NAND and NOR logic gates have been shown and described. These circuits may be used in combination to form more complex logic circuits. Combinations of inverters, NAND gates and NOR gates may be used to form implementations of logic functions of any complexity. Often, however, it is desirable to form single stages of more complex logic functions. One such more complex logical function is the Exclusive-OR gate shown and described in FIG. 6.

While the invention has been described in specific embodiments, it will be understood that modifications may be made by those skilled in the art and it is intended by the appended claims to cover all such modifications and changes as fall within the true spirit and scope of the invention.

What is claimed is:

1. In combination:
a plurality of P-channel transistors, each including a source, a drain, a source-adjacent gate, and a drain-adjacent gate,
a plurality of N-channel transistors, each including a source, a drain, a source-adjacent gate, and a drain-adjacent gate,
a plurality of input terminals,
an output terminal,
each source of said P-channel transistors being connected to a first reference potential,
each drain of said P-channel transistors being connected to said output terminal,
each source-adjacent gate of said P-channel transistors being connected to a respective input terminal,
each drain-adjacent gate of said P-channel transistors being connected to a third reference potential sufficiently negative with respect to said first reference potential to exceed the turn-on potential thereof,
the source-to-drain conduction paths of said N-channel transistors being connected in series in the order named between a second reference potential and said output terminal, said second reference potential being negative with respect to said first reference potential, each of the source-adjacent gates of said N-channel transistors being connected to a respective input terminal, each of the drain-adjacent gates of said N-channel transistors being connected to a fourth reference potential sufficiently positive with respect to said second reference potential to exceed the turn-on potential thereof.

2. In combination:

a plurality of P-channel transistors, each including a source, a drain, a source-adjacent gate, and a drain-adjacent gate, a plurality of N-channel transistors, each including a source, a drain, a source-adjacent gate and a drain-adjacent gate, a plurality of input terminals, an output terminal, the source-to-drain conduction paths of said P-channel transistors being connected in series in the order named between a first reference potential and said output terminal, each of the source-adjacent gates of said P-channel transistors being connected to a respective input terminal, each of the drain-adjacent gates of said P-channel transistors connected to a third reference potential sufficiently negative with respect to said first reference potential to exceed the turn-on potential thereof, each source of said N-channel transistors being connected to a second reference potential, said second reference potential being negative with respect to said first reference potential, each of the drains of said N-channel transistors being connected to said output terminal, each of the source-adjacent gates of said N-channel transistors being connected to a respective input terminal, each of the drain-adjacent gates of said N-channel transistors being connected to a fourth reference potential sufficiently positive with respect to said second reference potential to exceed the turn-on potential thereof.

* * * * *